United States Patent [19]

Bianchessi et al.

[11] Patent Number: 5,818,376
[45] Date of Patent: Oct. 6, 1998

[54] INTRODUCTION OF A WHITENER SIGNAL IN A SIGMA DELTA MODULATOR IN THE CONVERSION OF DIGITAL AUDIO SIGNALS

[75] Inventors: Marco Bianchessi, Sergnano; Sandro Dalle Feste, Novara; Nadia Serina, Castelcovati, all of Italy

[73] Assignee: SGS-Thomson Microelectronics S.r.l., Agrate Brianza, Italy

[21] Appl. No.: 798,737

[22] Filed: Feb. 13, 1997

[30] Foreign Application Priority Data

Feb. 23, 1996 [EP] European Pat. Off. ............... 96830081

[51] Int. Cl.⁶ .............................. H03M 1/08; H03M 7/00; H03M 1/66
[52] U.S. Cl. .............................................. 341/143; 341/131
[58] Field of Search ..................... 341/155, 143, 341/131, 166, 200

[56] References Cited

U.S. PATENT DOCUMENTS

| | | | |
|---|---|---|---|
| 4,990,914 | 2/1991 | Giancarlo | 341/143 |
| 5,073,777 | 12/1991 | Fukuhara et al. | 341/131 |
| 5,144,308 | 9/1992 | Norsworthy | 341/131 |
| 5,424,739 | 6/1995 | Norsworthy et al. | 341/143 |

FOREIGN PATENT DOCUMENTS

| | | |
|---|---|---|
| 0 515 154 A1 | 5/1992 | European Pat. Off. . |
| 5102851 | 4/1993 | Japan . |

*Primary Examiner*—Marc S. Hoff
*Assistant Examiner*—Peguy JeanPierre
*Attorney, Agent, or Firm*—Allen, Dyer, Doppelt, Milbrath & Gilchrist, P.A.

[57] ABSTRACT

A method of injecting a whitening random signal in a Sigma Delta modulator with a high-pass transfer function of a quantization noise filter of a certain order, for converting a digital audio signal sampled at a certain clock frequency into an analog signal, comprises the steps of generating a flat-spectrum dither signal, filtering the dither signal with a high-pass transfer function of an order higher than the order of the transfer function of the Sigma Delta modulator, and summing the filtered signal to the sampled digital audio signal, quantized by the modulator. The method prevents the occurrence of disturbances that would otherwise occur as a result of intermodulation of subtle colorations observable in the vicinity of the Nyquist frequency. The disclosed hardware implementation of the method adds little to the hardware complexity.

12 Claims, 8 Drawing Sheets

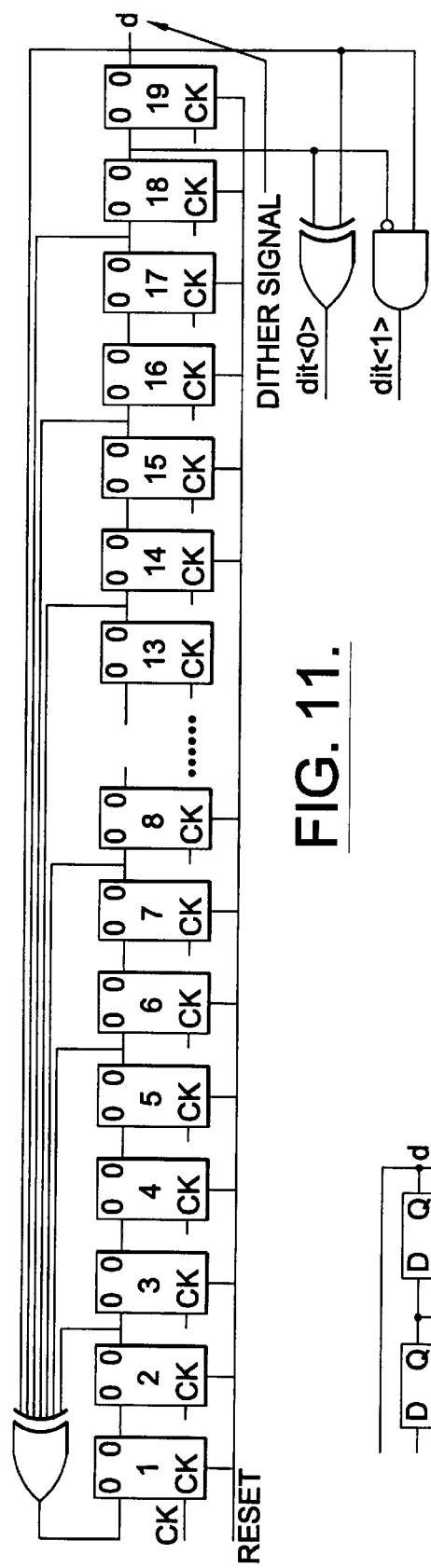
FIG. 11.
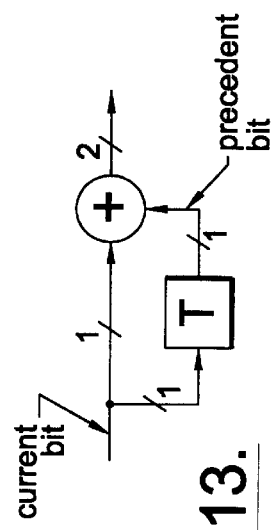
FIG. 13.
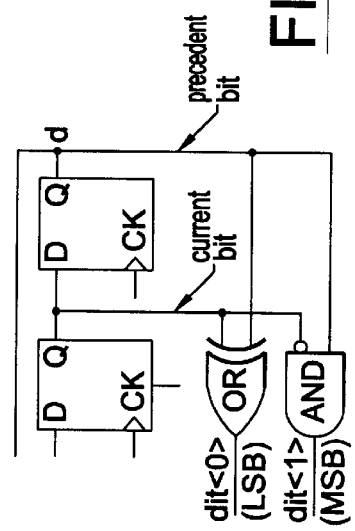
FIG. 12.
FIG. 14.
| current value | 0 | 0 | 1 | 1 |
|---|---|---|---|---|
| precedent value | 0 | 1 | 0 | 1 |
| complement two code | 00 | 11 | 01 | 00 |
| decimal result | 0 | -1 | 1 | 0 |

| Q(Z) output | decimal values of addendum | D(Z) output |  |  |  |
|---|---|---|---|---|---|
| | | decimal notation: | 1 | 0 | 2 |
| 0 (=positive) | 0 | -1 | 1 | | |
| | | complement 2 code | 001 | 000 | 010 |
| | | | (ABC) | (ABC) | (ABC) |
| | | decimal notation: | -1 | 0 | -2 |
| 0 (=negative) | 0 | -1 | 1 | | |
| | | complement 2 code: | 111 | 110 | 000 |
| | | | (ABC) | (ABC) | (ABC) |

# 5,818,376

INTRODUCTION OF A WHITENER SIGNAL IN A SIGMA DELTA MODULATOR IN THE CONVERSION OF DIGITAL AUDIO SIGNALS

FIELD OF THE INVENTION

The present invention relates to a method for introducing a casual whitening signal in a Sigma Delta modulator for the digital/analog conversion of audio signals.

BACKGROUND OF THE INVENTION

In the architecture of a so-called Sigma Delta modulator, utilized for the conversion of digital audio signals in an analog form, in a receiver of a digital audio broadcasting system (DAB) according to a coded orthogonal frequency division multiplexing (COFDM), it is often necessary to increment the integration order of the modulator, that is, of the quantizing noise filter quantizer to avoid the occurrence of annoying acoustic disturbances. Such problems consist substantially in the generation of so-called "limit cycles" that can be heard in the acoustic band, as well as of undesired tones due to intermodulation phenomena that takes place because of the nonlinearity of the analog stages that follow the Sigma Delta modulator.

This type of problem is usually accentuated by concomitant conditions of a high oversampling factor of the audio signal and of a relatively low integration order of the Sigma Delta modulator, that is, of the filter of the quantization noise of the modulator. On one hand, the increment of the integration order allows reduction of those problems by curing in advance the causes of the generation of the annoying acoustic effects. This solution, though effective, involves a large increase in the circuit complexity of the conversion systems, and above all may introduce other kinds of problems, from the design point of view of design solutions for a modulator capable of ensuring absolute stability.

Alternative solutions of this type of problems are known, according to which it is possible to minimize the above-mentioned effects in a Sigma Delta modulator of a relatively low order of integration, by the introduction in the base band of a purposely generated whitening or uncorrelation signal, commonly referred to as a "dither" signal. FIG. 1 exemplifies the functional scheme of a Sigma Delta modulator of the second order of integration, that represents a particularly preferred option for the realization of commercial receivers based on performance/cost considerations. Essentially the digital input signal X(z), oversampled over n-bits, is converted by the Sigma Delta modulator in a monobit signal Y(z). The quantizer discriminates the input signal (sign-bit follower) introducing a quantization noise Q(z).

The scheme of FIG. 1 can be reproposed in the form shown in FIG. 2 where the quantizer module is symbolically substituted by its equivalent functional model. The relationship between the input X(z) and the output Y(z) can be expressed by the following formulas:

$$Y(z)=A(z)+Q(z)$$

$$A(z)=X(z)+z^{-1}(z^{-1}Q(z)-2Q(z))$$

$$Y(z)=X(z)+z^{-1}(z^{-1}Q(z)-2Q(z))+Q(Z)$$

$$Y(z)=X(z)+Q(z)(1-z^{-1})^2$$

Practically, the output monobit signal Y(z) is the sum of the true digital signal X(z) and of the quantization noise Q(z), which noise is in turn filtered by a transfer function that practically eliminates it in the audio or base band by concentrating it in the high frequency band. The shifting function $(1-z^{-1})^2$ that produces such a filtering or shaping of the quantization noise Q(z) is shown in the diagram of FIG. 3.

Commonly, the architecture of this type of Sigma Delta modulator is referred to as of the second order, due to the exponent in the "noise shaping" function $(1-z^{-1})^2$. In the case of a modulator of the second order as the one shown, the introduction of a "whitening" or uncorrelation signal in the base band, that is, a so-called dither signal, is generally not considered necessary because the quantization noise Q(z), introduced by the quantizer block of the modulator, is in itself sufficiently white. In other words, it already possesses a substantially flat-spectrum within the whole band of interest.

Despite these premises and that the model of analysis of the transfer function, necessarily linearized, demonstrates a nearly absence of signal coloration, listening tests and spectrum analysis show that the quantizer, due to its nonlinearities, does in effect cause a certain "coloration" of the signal at high frequencies. Therefore, the inevitable phenomena of intermodulation that takes place tends to provoke a fall back, in the audio band, of harmonics or tones corresponding to the coloration peaks present at high frequencies, that is, outside the audio band or base band as it is often referred to.

In practice, it may be observed that for a specific case of low dynamic sinusoidal input signals, the spectrum of the quantizer signal at high frequencies is characterized by peaks (spikes) of coloration. These high frequency tones have repercussions in the audio band through intermodulation phenomena. By examining, for example, the spectrum characteristics of the output signal Y(z) of a Sigma Delta modulator as described above, stimulated by a sinusoidal input signal whose dynamic decreases gradually and which is oversampled by an even factor, for example 256, although, in base band, no particular colorations of the quantizer noise are observed in respect to the input signal, this is no longer true at high frequency and above all in the vicinity of the Nyquist frequency. A typical trend of the spectrum of the output signal Y(z) upon varying the dynamic of the input signal X(z) is shown in FIG. 4.

By analyzing FIG. 4, it can be observed that by decreasing the dynamic of the input signal, the output signal spectrum becomes more and more colored and with a greater and greater content of high frequency energy. This spectrum characteristic of the output signal Y(z) is regarded as being the cause of the observed occurrence of intermodulation phenomena of frequencies in the vicinity of the Nyquist frequency whose intermodulation products fall, though attenuated, in the acoustic band. This is so because of the nonlinearity of the analog output stage that converts the monobit signal (bitstream) in an analog signal by filtering the quantizer noise Q(z) which is typically concentrated at high frequencies. On the other hand, the known approach of introducing a whitening dither signal in the base band appears to be inefficient in the case mentioned above, because the quantization noise signal has a spectrum sufficiently flat in the base band (in other words is in itself already sufficiently white).

In these conditions, a common approach to overcome the problem represented by the occurrence of abrupt acoustic disturbances, is that of employing a Sigma Delta modulator of a higher order for two fundamental reasons:

1) the quantizer noise Q(z) is in this case even whiter, upon varying the dynamic of the input signal; and 2) for the same signal/noise ratio, it is possible to decrease the oversampling factor, thus allowing the Sigma Delta modulator to operate at lower frequencies, and thus making the system intrinsically less affected or sensitive to the above mentioned intermodulation phenomena.

The increase of the order of integration of the Sigma Delta modulator implies a parallel increase of the complexity of the modulator and, as a consequence, an increase of the silicon area necessary for its integration with nonnegligible effects on the overall cost of the devices. Moreover, by increasing the order of integration of the modulator, the circuit becomes more difficult to design, because intrinsic problems of instability are accentuated. The cost and the problems of realization of a Sigma Delta modulator of an order higher than the second have motivated the research of less expensive alternative solutions in an attempt to curb the above noted undesired phenomena. For this purpose whitening dither signals, with a rectangular, triangular shape, etc., are used at nonhearable frequencies. If on one hand such signals effectively prevent the generation of "limit cycles" tones, on the other, they are completely ineffective in preventing intermodulation phenomena as they are themselves strongly colored signals.

The use of dither signals with different characteristics has been suggested, that is, the use of signals with a substantially flat-spectrum in the frequency range in which the particular Sigma Delta modulator shows the tendency of producing a peculiarly colored spectrum, as in the example shown in FIG. 4. The generation of dither signals shaped in this way is known to be costly in terms of the requirement of logic circuitry that has to be dedicated for the generation of this type of particularly complex dither signal.

Therefore, there exists the need and/or usefulness of a method for introducing a whitening dither signal that does not cause disturbing intermodulation phenomena in the base or audio band in Sigma Delta modulators of a relatively low order of integration, and, in particular, in second order modulators, without a significant requirement for additional hardware.

SUMMARY OF THE INVENTION

These and other objectives and relative advantages are fully obtained by the method and by the associated circuit architecture of the present invention. Fundamentally, the method of the invention is based on the introduction of a prefiltered dither signal. The dither signal is generated with a flat-spectrum throughout the oversampled signal band and undergoes a filtering with a function of the high-pass type and of an order higher than the order of the transfer function of the quantization noise filter of the modulator. In this way, the whitening effect of the dither signal introduced in the high frequency range is "concentrated" efficiently in such a way that the unavoidable phenomena of intermodulation can take place with a relatively high frequency signal and therefore they do not give rise to perceivable effects in the acoustic band (or audio or base band). Moreover, the prefiltering of a flat-spectrum dither signal according to a transfer function of a higher order than that of the quantization noise filter, eliminates or reduces in an extremely effective way, the influence of the introduced dither signal in the base or acoustic band, resulting in there being attenuated more than the quantization noise introduced by the modulator's quantizer. The quantization noise is filtered according to a transfer function of the same high-pass type but of a lower order.

According to another important aspect of the invention, the method is implementable with a minimum burden of additional logic circuitry, beyond that customarily required for generating a normal flat-spectrum dither signal. In practice, the required prefiltering of the dither signal according to a transfer function of higher order than that of the quantizer of the modulator and its introduction are realized by means of a simple first order differentiator plus the addition of two particularly simple adder stages to the basic functional scheme of a Sigma Delta modulator.

BRIEF DESCRIPTION OF THE DRAWINGS

These and other aspects and relative advantages of the invention will become even more evident through the following description of an important embodiment and by referring to the attached drawings, wherein:

FIG. 11 shows the architecture of the invention for implementing a first term of the transfer function of the third order;

FIG. 12 is a partial scheme that shows the way of obtaining a decimal result representative of a first order differentiation of the dither signal d;

FIG. 13 shows the classical differentiation scheme;

FIG. 14 illustrates by way of a table the functioning of the circuit of FIG. 12;

DETAILED DESCRIPTION OF PREFERRED EMBODIMENTS

Figure 5:
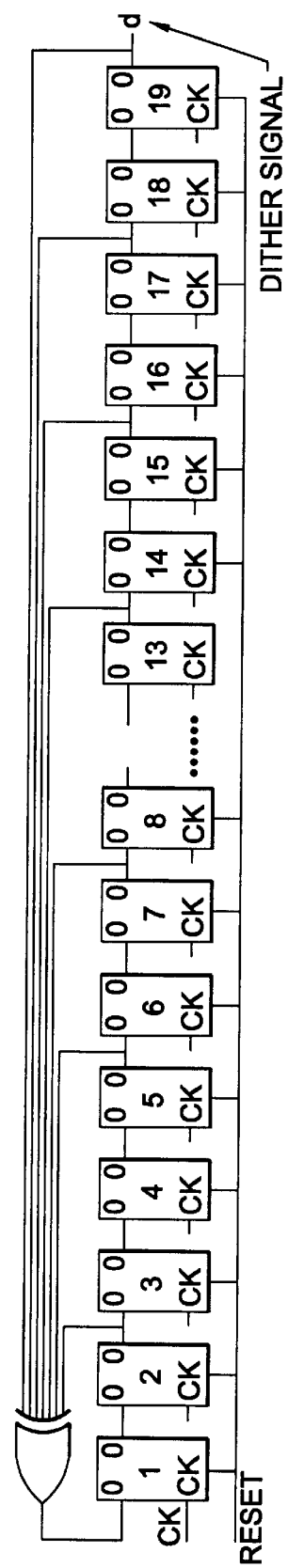
FIG. 5 shows a circuit architecture for the generation of a flat-spectrum dither signal in base band in accordance with the present invention.

By referring to the scheme of FIG. 5, a dither signal with an eminently flat-spectrum throughout the entire frequency range of the oversampled digital input signal can be produced by an n-bit register (20 in the case of the example illustrated in the figure), comprising an array of bistable circuits (D-Latch) 1, 2, . . . , 18, 19, synchronized by the sampling clock signal CK of the input signal. A plurality of outputs (Q) of the cascade of the bistable stages (D-Latch), are connected, to as many inputs of a logic OR gate and the output signal of the OR gate is fed to the input (D) of the first bistable circuit of the multibit register array. At the Q output of the last bistable circuit of the array is available a "monobit" signal d having a substantially flat-spectrum throughout the entire frequency band of the oversampled digital input signal (sampled at the clock frequency CK). Although there exist theories defining which of the n outputs of the n-bit shift register should preferentially be fed to the inputs of the OR gate, for accentuating the "whiteness" of the dither signal d produced, these are controversial and generally the selection of the register taps to be OR-connected may be random.

Figure 3:
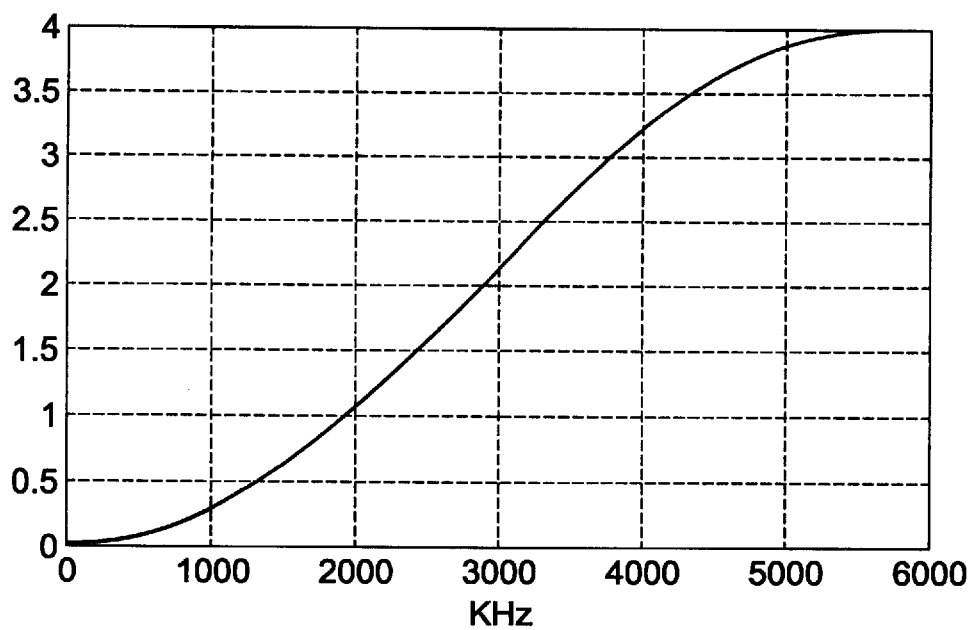
FIG. 3 shows the frequency characteristic of the transfer function of the prior art quantizer.
Figure 6:
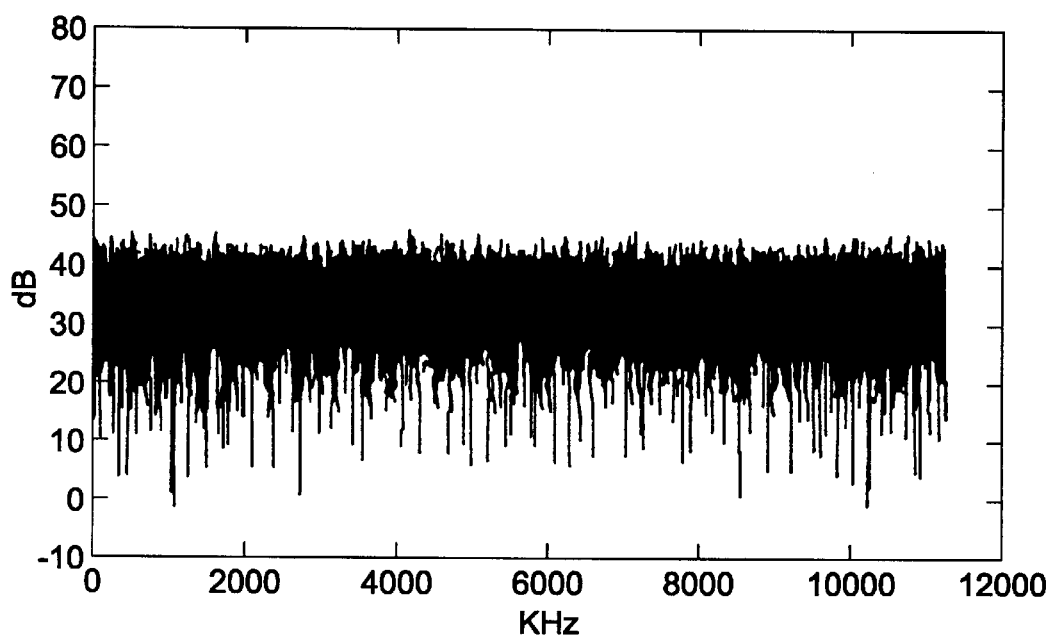
FIG. 6 shows the spectrum of a dither signal generated by the circuit of FIG. 5.

The signal d, present at the output Q of the last stage of the shift register, has a spectrum which is effectively flat in the whole frequency band of interest, as shown in FIG. 6. As already illustrated in FIG. 3, the function $(1-z^{-1})^n$ implements a transfer function of a high-pass filter of the $n^{th}$ order, producing an attenuation at low frequencies and an amplification at high frequencies.

According to an important aspect of the invention, a practically null effect of the dither signal in the audio band and conversely an accentuated whitening effect, such as to nullify the peculiar colorations of the signal at high frequency, are ensured by filtering a flat-spectrum dither signal by a high-pass transfer function, that is, of the same type as that of the filter of the quantization noise of the modulator, but of a higher order than the latter and by injecting the resulting signal so prefiltered in the modulator (in practice by summing it to the sampled input signal). In the herein described embodiment of the invention, being that the Sigma Delta modulation under consideration is of the second order, the flat-spectrum dither signal must be filtered by a high-pass function of the third order or higher.

Figure 7:
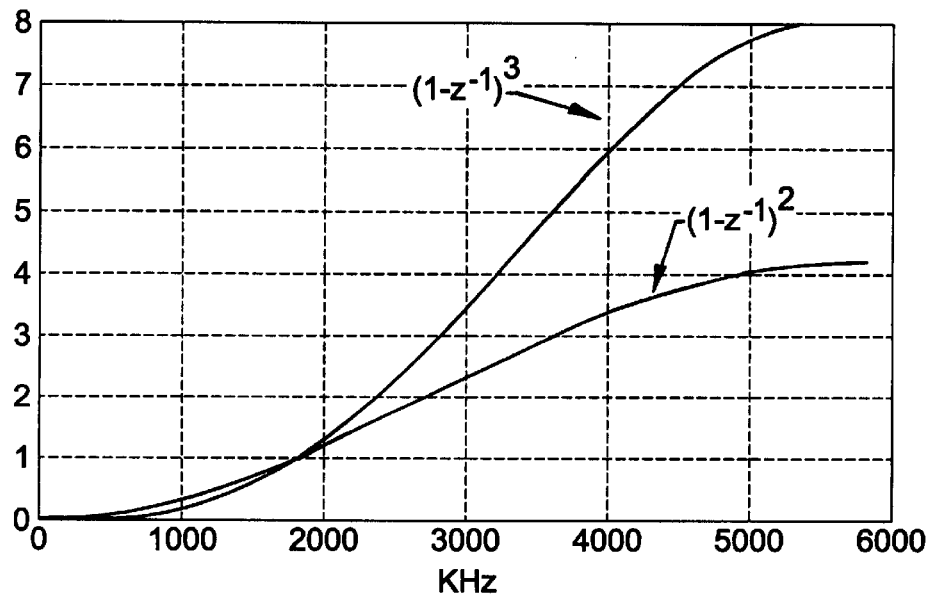
FIG. 7 shows the frequency characteristic of the transfer functions of the high-pass filter of third order of the dither signal and of the high-pass filter of the second order of the quantization noise of the modulator of the invention.

The relationship existing between the two high-pass functions, is that one is applied to the quantization noise of the modulator and the other applied, according to the invention, to a flat-spectrum dither signal as illustrated in FIG. 7, after equalization of the dynamics of the quantization noise Q(z) and of the dither signal d. As observed from FIG. 7, the dither signal d is amplified at high frequencies while it is attenuated in a more accentuated manner than the quantization noise at low frequency and eminently in the audio band. Therefore, the whitening effect is enhanced at the high frequencies, notably in the vicinity of the Nyquist frequency where a peculiar coloration that is transferred on the output signal of the quantizer block of the modulator, may be observed.

Figure 8:
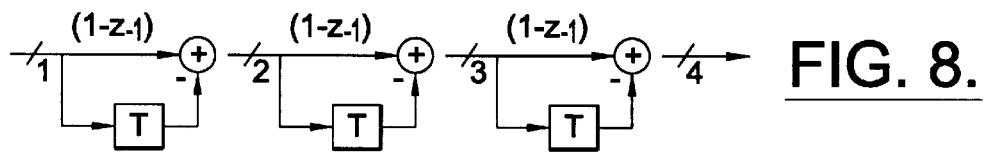
FIG. 8 shows the classical circuit diagram for implementing a high-pass function of the third order.

Of course, a spontaneous adverse contention arises that is tied to the known demanding hardware requisites for implementing a transfer function of at least a third order $(1-z^{-1})^3$, that is, of a higher order than that of the modulator which in the example considered is of the second order. In fact, a classical scheme of implementation of a transfer function $(1-z^{-1})^3$ is shown in FIG. 8. Indeed, as it may be noticed, the implementation of a transfer function of third order would require, according to the classical scheme, the use of three differentiating stages (normally three appropriately configured ripple carry adders).

Figure 9:
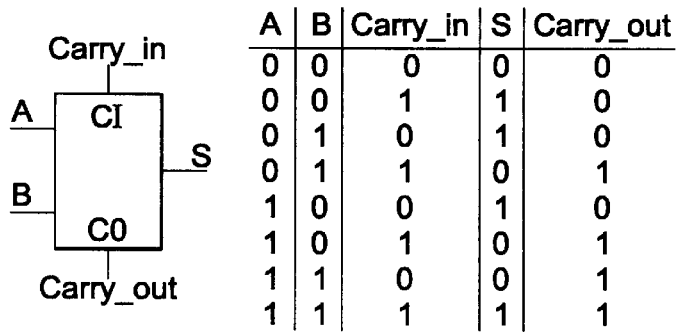
FIG. 9 shows the scheme and the relative truth table of a full-adder module used for performing the sum in complement-two, of two-bits.

The basic module for the realization of an adder is a circuit referred to as full-adder, capable of carrying out the sum, by complement-two, between two-bits, namely: A and B. The scheme of a full-adder module together with its relative truth table is shown in FIG. 9.

A and B represent the two-bits being added, the input carry_in is available for an eventual carry-over originating from a preceding stage, the output carry_out represents the value to be eventually carried over to a subsequent stage, while the output S provides the result of the sum between the two-bits A and B. An adder of any number n of bits may be realized connecting in cascade an adequate number of full-adder stages.

Figure 10:
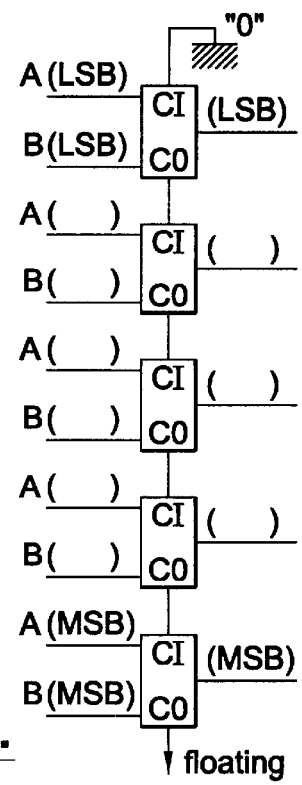
FIG. 10 shows the scheme of an adder composed by a cascade of full-adder modules.

A typical realization of an adder referred to as of the "ripple carry" type, of 5 bits, realized by the use of five full-adder modules is shown in FIG. 10. Of course it is also possible to implement a difference function instead of a sum function using in practice the same architecture represented by a cascade of full-adder modules, by preventively inverting one, for example the second, of the two addends A and B and by summing to it a value 1, according to what is required by a complement-two coding. Therefore, with reference to the scheme of FIG. 10, if a complement-two sum must be performed, the carry_in node of the full-adder module relative to the least significative bit (LSB) is connected to ground. The carry_out node CO of the last full-adder module, relative to the sum of the most significant bit (MSB), can be left floating. This terminal is connected only in case of systems that include overflow means. In general, adders are realized with a number of modules sufficient to prevent reaching an overflow condition during the normal functioning of the system, that is, for a certain maximum dynamic of the digital signals.

When a difference function must be implemented, one of the addends of the various full-adder modules, for example, the addend B, is preventively inverted and the carry_in node of the first full-adder module is set to 1, for example, by connecting it to the supply. The number of adders (or differentiators) required and the respective number of bits of each of them, represents an important cost factor in terms of the hardware to be integrated.

According to an important aspect of the present invention, the implementation of the required transfer function of a higher order than that of the modulator that, in the case under consideration, would be a transfer function of the third order, is achieved in an extraordinarily efficient way, markedly reducing costs, in terms of a reduced requirement of additional hardware. By splitting the transfer function of the third order in two factors $(1-z)$ and $(1-z^{-1})^2$, the first factor of the function can be implemented practically without any burden on the cost, through a very simple modification or addition to the logic circuit commonly used for generating a flat-spectrum dither signal, as shown in FIG. 5.

FIG. 11 shows the way such an important result is obtained. In practice, the first term of the transfer function is advantageously implemented by the use of two simple gates and an inverter, and precisely a two input OR gate and a two input AND gate. At the two inputs of the two gates are applied, respectively, the current bit of the dither signal d present at the output Q of the second to last bistable stage (D-Latch 18) of the dither generating shift register (that is at the input D of the last bistable stage (D-Latch 19)) and the preceding bit of the same dither signal, present at the output Q of the last bistable stage of the shift register.

As schematized in detail in FIGS. 12, 13 and 14, the two gates produce in practice a two-bits difference value dit <1> and dit <2> between two successive samples of the dither signal d, in a complement-two code. In practice, the scheme of FIG. 12 realizes a transfer function equivalent to that of a classical differentiator of the first order whose scheme is shown in FIG. 13. The result of the difference between an actual or current value and the precedent value is made available without employing a full-adder.

FIG. 14 shows how the desired decimal result is obtained for all possible combinations. Therefore, the two-bits: dit <0> and dit <1>, produced, respectively, at the output of the OR gate and of the AND gate, identified respectively as LSB and MSB in the scheme of FIG. 12, represent the derivative of the first order of the dither signal d.

Figures 15, 16:
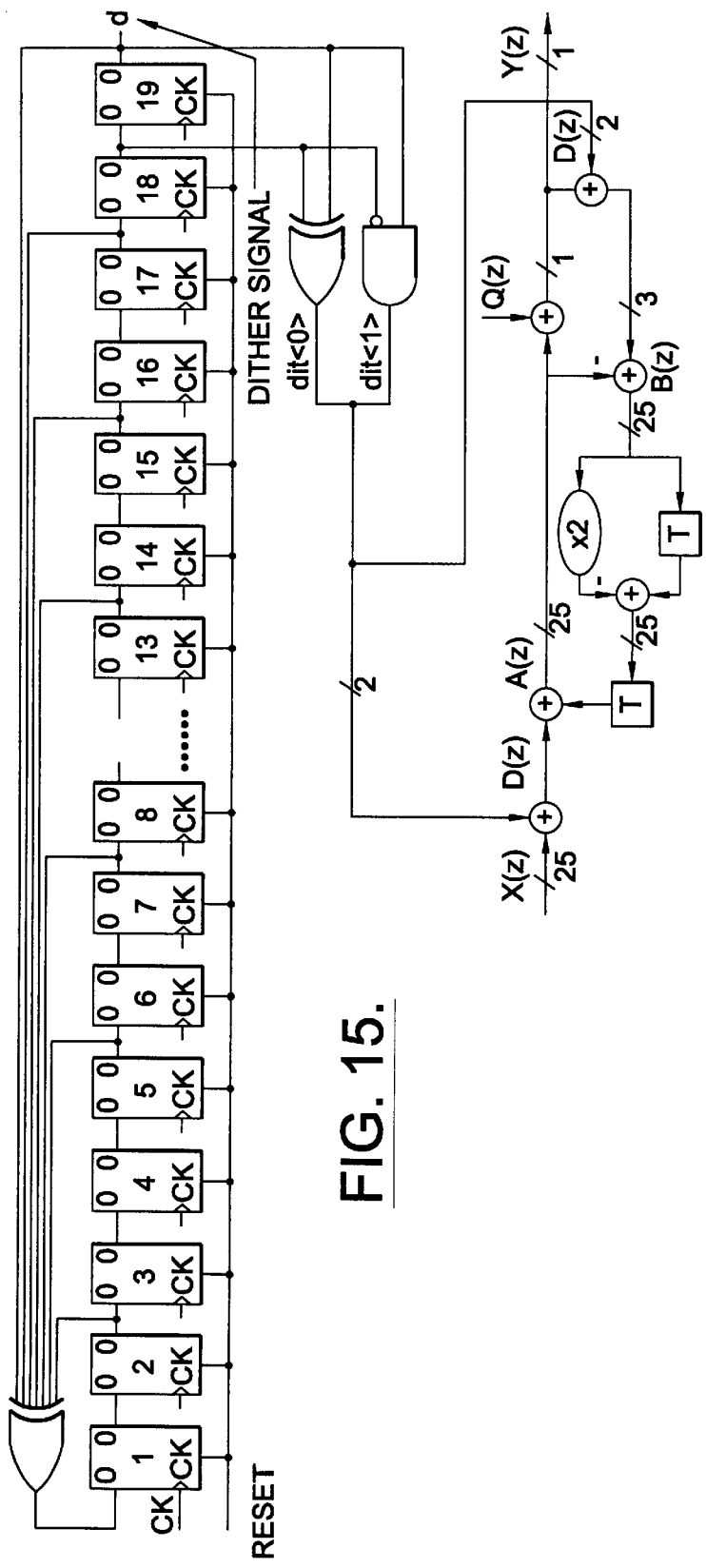
FIG. 15 is a complete functional diagram of a modulator of second order realized according to the present invention.
FIG. 16 illustrates the way of a table the function of the first additional adder D(z) implemented at the output of the quantizer (Qz) of the basic scheme of a Sigma Delta modulator, according to the present invention.

FIG. 15 shows the entire functional scheme of the Sigma Delta modulator comprising the relative circuitry for the generation, prefiltering and injection of the prefiltered dither signal, according to the present invention. As noticed from the scheme of FIG. 15 and described hereinbelow in more detail, the prefiltering of the dither signal d, using a transfer function of the third order, that is, of a higher order than the order of the modulator (in other words of the quantizer) taken into consideration, and its introduction, are implemented besides by the pair of gates (OR and AND) that perform in practice a first order differentiation of the dither signal d, by two additional simple adder stages, practically of only two-bits≠0, in consideration of the basic scheme of the Sigma Delta modulator.

By analyzing the functional scheme of FIG. 15 and recognizing in the signal D(z) that is introduced through the two homonymous adder stages, the dither signal d(z) is prefiltered by a transfer function of the first order $(1-z^{-1})$, the following analysis may be made:

$$Y(z)=A(z)+Q(z)$$

$$B(z)=A(z)-(D(z)+Y(z))$$

$$A(z)=X(z)+D(z)+z^{-1}(z^{-1}B(z)-2B(z))$$

thence:

$$Y(z)=X(z)+D(z)+z^{-1}(z^{-1}(D(z)+Q(z))-2(D(z)+Q(z)))+Q(z)$$

$$Y(z)=X(z)+Q(z)(1-z^{-1})^2+D(z)\,(1-z^{-1})^2$$

Therefore, the overall transfer function can be written as follows:

$$Y(z)=X(z)+Q(z)\,(1-z^{-1})^2+d(z)\,(1-z^{-1})^3$$

Figure 1:
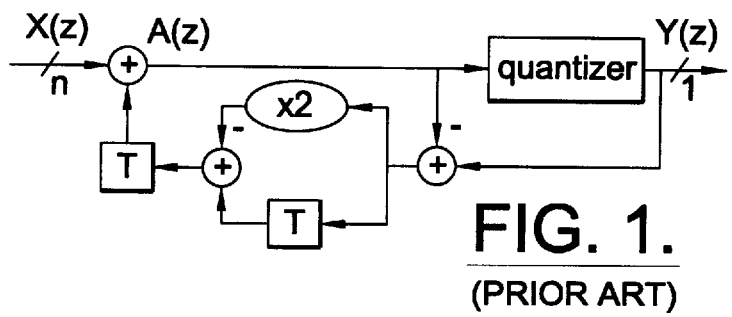
FIG. 1 is a block diagram of Sigma Delta modulator of the second order as in the prior art.
Figure 2:
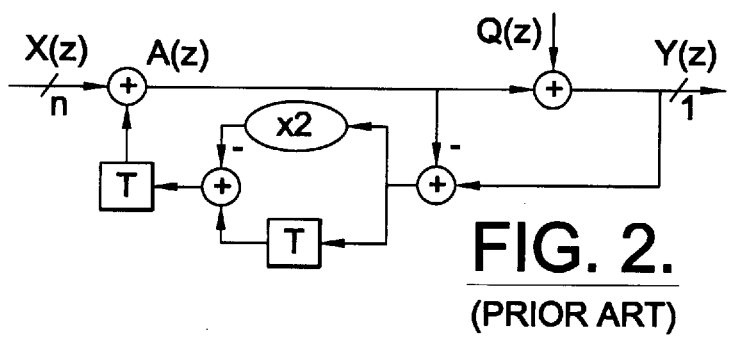
FIG. 2 is a functional scheme of the prior art modulator of FIG. 1 where the quantizer is substituted by its equivalent functional symbol.
Figure 17:
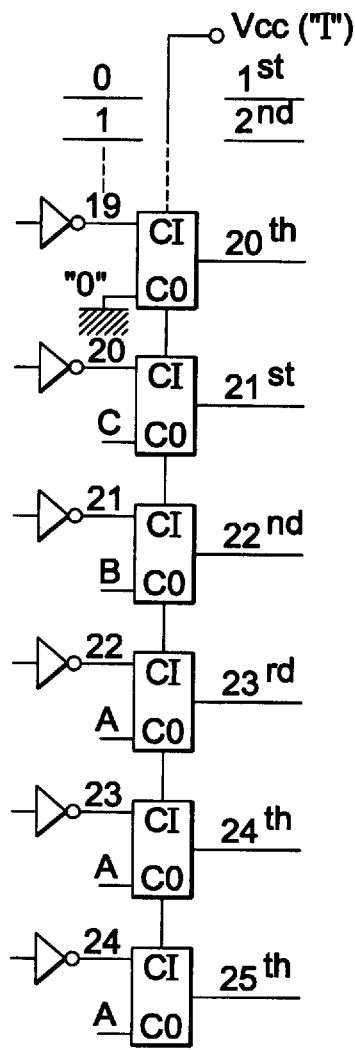
FIG. 17 is a partial scheme of the differentiation stage B(z) according to the modification made to the basic scheme according to the present invention.

By comparing the entire scheme of FIG. 15 with the basic scheme of FIG. 2, the function of the first one of the two two-bit adder stages D(z), introduced downstream of the quantizer, is illustrated by way of a table in FIG. 16. The result of the sum among the possible values of the quantizer output and of the two-bits: dit <0> and dit <1>, produced at the output of the two gates OR and AND, respectively, whose decimal value, according to a complement-two code (re: FIG. 14) is reported in FIG. 16, produces the indicated decimal result which is coded in complement-two over three bits, identified as A B C, respectively. Therefore, instead of the one bit addend as produced by the quantizer, a three bit addend produced by this first additional adder D(z) of the differentiation loop of the basic scheme of the Sigma Delta modulator is used. The way in which this is carried out is schematically shown in FIG. 17.

Figure 4:
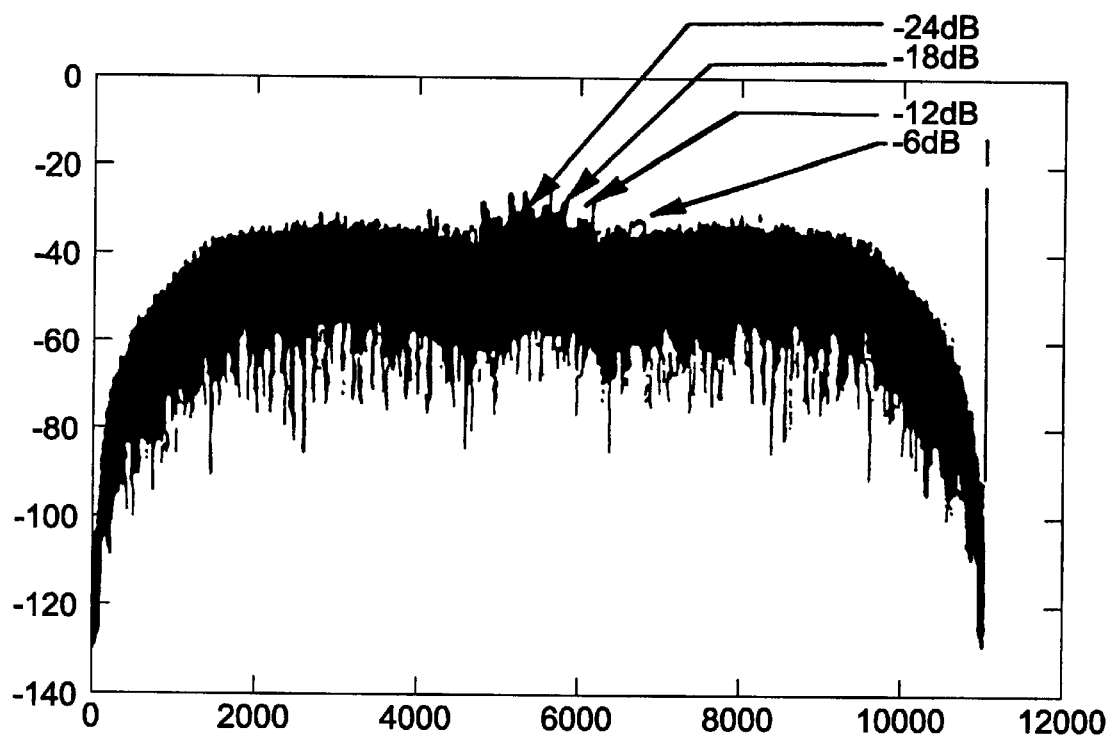
FIG. 4 shows the spectrum of an output signal of the prior art modulator of FIG. 1 when varying the dynamic of an oversampled and sinusoidal input signal.

In the example considered, it is assumed that the differentiation stage B(z) of the basic scheme of Sigma Delta modulator be of 25 bits, so to provide an adequate margin to avoid overflow phenomena. As indicated in the scheme, being this a differentiation operation, the carry_in terminal of the first full-adder module is set at "1" (that is connected to the supply), whereas an array of inverters is employed for inverting the sign of the 25 bits. A shift, that is a multiplication by $2^{20}$ of the other three bit addend (A, B, C) produced by the first additional adder D(z) for sufficiently incrementing the dynamic of the whitening dither signal in order to "cover" adequately the intermodulation peaks highlighted in FIG. 4, is realized substantially without any burden by simply setting to "0" (connecting to ground) the second input of each full-adder module for the first 20 of the total 25 modules that make up the differentiator B(z). This because, in a complement-two coding, the value $2^{20}$ is equal to a "1" followed by nineteen "0"s. By defining A the most significant bit (MSB), B the bit of intermediate weight and C the least significant bit (LSB) of the three bits resulting from the sum of the output of the quantizer Q(z) and of the decimal result, coded in complement-two, of the first order differentiation of the dither signal, expressed by the pair of values: dit <0> and dit <1>, the C bit will be applied to the second input of the twentieth full-adder module. The B bit will be applied to the second input of the twenty-first full-adder module and the bit A will be applied to the second input of the twenty-second full-adder module of the adder B(z) and, according to a common practice, also to the remaining full-adder modules to the last or twenty-fifth.

The illustrated architecture of the invention of FIG. 15, contemplates further a second adder stage D(z) to sum the decimal result, in complement-two coding, a first order differentiation of the dither signal, expressed by the pair of values: dit <0> and dit <1>, to the 25 bit oversampled input signal X(z).

Figure 18:
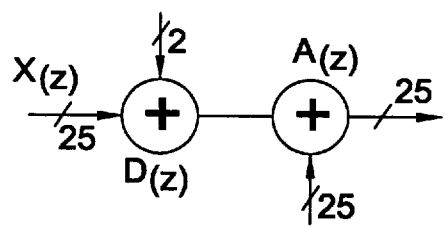
FIG. 18 highlights a part of the basic scheme of the Sigma Delta modulator, modified with the addition of an adder stage of the dither signal to the sampled input signal of the modulator, according to the present invention.

According to another important aspect of the invention, this operation, schematized in the partial diagram of FIG. 18, is implemented in a least burdensome manner, in terms of additional hardware required. The implementation scheme of this introduction of the dither in the oversampled input signal is shown in FIG. 19.

Figure 19:
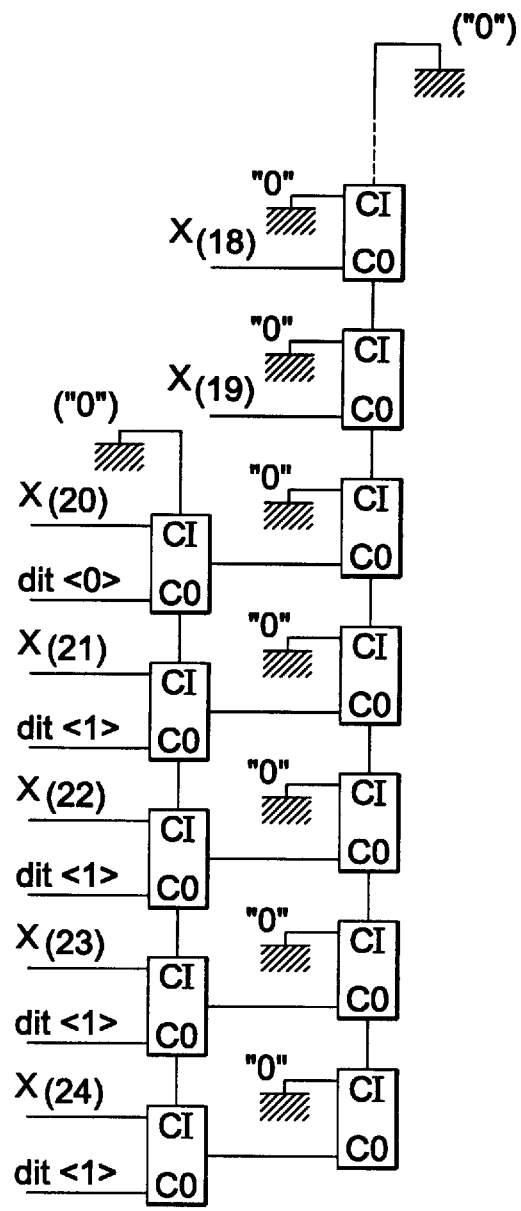
FIG. 19 is a partial scheme that shows how such a modification highlighted in FIG. 18 can be realized, according to one aspect of the invention.

By referring to the partial diagram shown in FIG. 19, the cascade of 25 full-adder modules, of which only the last seven are shown, represent the 25 bit adder A(z) of the basic scheme of the Sigma Delta modulator. The sum of the decimal result of a first order differentiation of the dither signal d, in complement-two code, expressed by the pair of values: dit <0> and dit <1>, following its the multiplication by a factor $2^{20}$, to increase the dynamic of the dither signal by the same amount as done in the differentiation loop, to the input signal X(z) of the Sigma Delta modulator is effected by the addition of only five full-adder modules, as shown in the right portion of the diagram of FIG. 19.

Even in this case, a shift (multiplication) by $2^{20}$ is obtained without any additional burden, by summing the least significant bit (dit <0>) to the twenty-first bit (X(20)) of the input signal and the most significant bit (dit <1>) to the twenty-second bit (X(21)) as well as to all the remaining bits to the last (X(24)), that is to the twenty-fifth bit as managed by the adder A(z).

Figure 20:
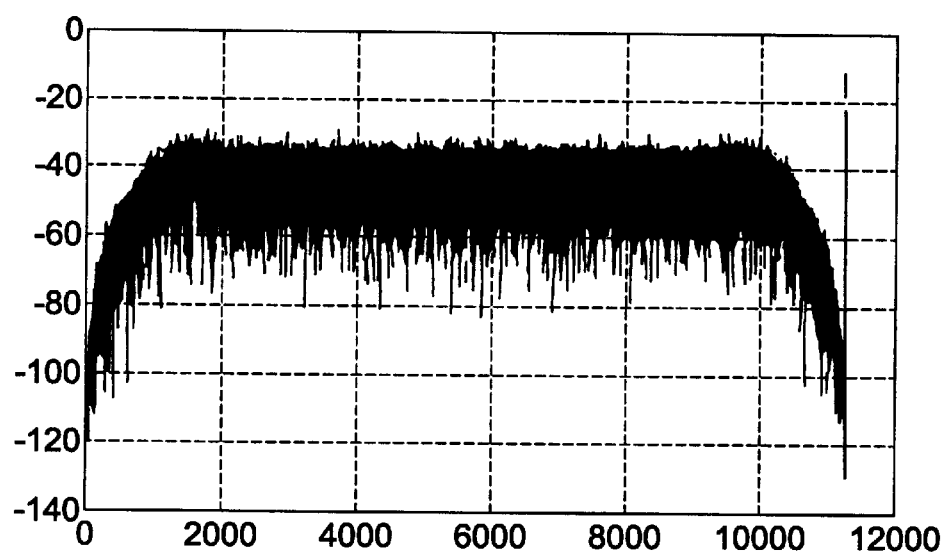
FIG. 20 shows the spectrum of the output signal of the modified modulator of the invention of FIG. 15.

The spectrum of the output signal of the modulator Y(z) during the variation of the oversampled input signal X(z), obtained with the addition of the prefiltered dither signal prefiltered according to the present invention, is shown in FIG. 20. As easily observed by comparing the spectrum of FIG. 20, obtained by a modulator modified according to the present invention, with the spectrum of a similar modulator of the second order without the modifications of the invention shown in FIG. 4, demonstrates the outstanding effectiveness of the invention in eliminating disturbances caused by intermodulation because of the unavoidable nonlinearity of the final analog stage of the converter. The spectrum of FIG. 20 is significantly free of the tones that can be observed in the spectrum of FIG. 4. In practice the prefiltering and injection of the dither signal according to the invention is realized with a minimum and practically negligible addition of hardware: substantially a two-bit adder, five full-adder modules and two gates.

We claim:

1. A method of introducing a whitening random signal in a Sigma Delta modulator for converting a digital audio signal sampled at a certain clock frequency into an analog signal, with a high-pass transfer function of a quantization noise filter of a certain order, the method comprising the steps of:

generating a dither signal having a flat-spectrum throughout an entire frequency band of an input sampled audio signal;

filtering the dither signal having the flat spectrum by employing a high-pass transfer function of an order higher than an order of the high-pass transfer function of the quantization noise filter of the Sigma Delta modulator;

summing the filtered dither signal to the sampled input audio signal, quantized by the Sigma Delta modulator; and outputting a monobit signal having a substantially flat-spectrum in a frequency band of the input sample audio signal where the monobit signal has a high-pass transfer function of a third order, that is implemented by generating a two-bit difference value in a complement-two code between a current sample of the monobit signal and a preceding sample.

2. The method according to claim 1, wherein the dither signal having the flat spectrum is generated by using an n-bit register comprising an array of bistable circuits synchronized by the clock frequency; wherein a plurality of outputs of the bistable circuits connected in cascade are coupled to as many inputs of an OR gate, and the output signal of the OR gate is coupled to an input of the first bistable circuit of the n-bit register; and wherein a last one of the bistable circuits outputs the monobit signal having the substantially flat-spectrum in a frequency band of the input sampled audio signal.

3. The method according to claim 2, wherein the high-pass transfer function of the quantization noise filter of the Sigma Delta modulator is of second order; and wherein the monobit signal having the substantially flat-spectrum is filtered through a filter having a high-pass transfer function of third order, a first term of the transfer function of third order being implemented by generating the two-bit difference value, in a complement-two code, between a current sample of the monobit signal and a preceding sample, and a second term of the transfer function of third order being implemented by adding the two-bit difference value, in complement-two code, to a quantization noise signal in a differentiation loop of second order of the Sigma Delta modulator and to the input sampled audio signal.

4. The method according to claim 3, wherein the addend represented by the difference value in complement-two code is premultiplied by a factor $2^n$.

5. A circuit for introducing a whitening dither signal in a Sigma Delta modulator comprising:

a generator circuit of a flat-spectrum monobit signal comprising an n-bit shift register including an array of n–1 bistable circuits synchronized by a clock signal;

an OR circuit having a plurality of inputs, one of which is connected to an output of a last bistable circuit of the array, while the other inputs are connected to as many intermediate nodes of said n-bit shift register, and an output coupled to an input of a first bistable circuit of the array;

a differentiator circuit of first order, capable of producing a two-bit difference value, in a complement-two code, between two subsequent samples of the flat-spectrum monobit signal;

first adder means capable of summing the two-bit difference value, in a complement-two code, to a quantization signal in a differentiation loop of the Sigma Delta modulator; and second adder means capable of summing the two-bit difference value, in a complement-two code, to an input sampled signal of the Sigma Delta modulator.

6. The circuit according to claim 5, wherein said differentiator circuit of first order comprises a two-input OR gate and a two-input AND gate, each having a first input coupled, in a direct manner and through an inverting stage, respectively, to the output of the last bistable circuit and the second input coupled to the input of the last bistable circuit, two-bit difference value, in complement-two code, between two subsequent samples of the flat-spectrum monobit signal being available at the outputs of said gates.

7. The circuit according to claim 5, wherein said first adder means comprises a ripple-carry adder capable of adding the one bit signal output by the quantizer of the Sigma Delta modulator to the two-bit difference value, in complement-two, producing a three-bit output signal in complement-two code.

8. The circuit according to claim 5, wherein said second adder means comprises a number N of full-adder modules, capable of adding a least significant bit of the two-bit difference value in complement-two code to the bit K–N and the most significant bit to the bit K–(N–1) and to the remaining bits of the K-bit adder of the sampled input signal of the Sigma Delta modulator.

9. A Sigma Delta modulator for a receiver of a digital audio broadcast signal, comprising:

a generator circuit of a flat-spectrum monobit signal comprising an n-bit shift register including an array of n–1 bistable circuits synchronized by a clock signal;

an OR circuit having a plurality of inputs, one of which is connected to an output of a last bistable circuit of the array, while the other inputs are connected to as many intermediate nodes of said n-bit shift register, and an output coupled to an input of a first bistable circuit of the array;

a differentiator circuit of first order, capable of producing a two-bit difference value, in a complement-two code, between two subsequent samples of the flat-spectrum monobit signal;

first adder means capable of summing the two-bit difference value, in a complement-two code, to a quantization signal in a differentiation loop of the Sigma Delta modulator; and second adder means capable of summing the two-bit difference value, in a complement-two code, to an input sampled signal of the Sigma Delta modulator.

10. The Sigma Delta modulator according to claim 9, wherein said differentiator circuit of first order comprises a two-input OR gate and a two-input AND gate, each having a first input coupled, in a direct manner and through an inverting stage, respectively, to the output of the last bistable circuit and the second input coupled to the input of the last bistable circuit, two-bit difference value, in complement-two code, between two subsequent samples of the flat-spectrum monobit signal being available at the outputs of said gates.

11. The Sigma Delta modulator according to claim 9, wherein said first adder means comprises a ripple-carry adder capable of adding the one bit signal output by the quantizer of the Sigma Delta modulator to the two-bit difference value, in complement-two, producing a three-bit output signal in complement-two code.

12. The Sigma Delta modulator according to claim 9, wherein said second adder means comprises a number N of full-adder modules, capable of adding a least significant bit of the two-bit difference value in complement-two code to the bit K–N and the most significant bit to the bit K–(N–1) and to the remaining bits of the K-bit adder of the sampled input signal of the Sigma Delta modulator.

* * * * *